(12) United States Patent
Murad et al.

(10) Patent No.: US 10,079,255 B1
(45) Date of Patent: Sep. 18, 2018

(54) COLOR FILTER ARRAY APPARATUS

(71) Applicant: GM GLOBAL TECHNOLOGY OPERATIONS LLC, Detroit, MI (US)

(72) Inventors: Mohannad Murad, Troy, MI (US); Joseph Machak, Oakland Township, MI (US); Donald Gignac, Waterford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/668,944

(22) Filed: Aug. 4, 2017

(51) Int. Cl.
*H01L 27/146* (2006.01)
*G06K 9/00* (2006.01)
*H04N 9/04* (2006.01)

(52) U.S. Cl.
CPC .... *H01L 27/14621* (2013.01); *G06K 9/00798* (2013.01); *G06K 9/00825* (2013.01); *H04N 9/045* (2013.01); *H01L 27/14627* (2013.01)

(58) Field of Classification Search
CPC ........ H01L 27/14621; H01L 27/14627; G06K 9/00798; G06K 9/00825; G06K 9/00791; H04N 9/045
See application file for complete search history.

(56) References Cited

U.S. PATENT DOCUMENTS

| | | | | |
|---|---|---|---|---|
| 2007/0177014 A1* | 8/2007 | Frenzel | .............. | G06K 9/00798 348/148 |
| 2010/0134616 A1* | 6/2010 | Seger | .................... | H04N 9/045 348/135 |
| 2010/0141812 A1* | 6/2010 | Hirota | .................... | H04N 9/045 348/279 |
| 2010/0259628 A1* | 10/2010 | Rous | ....................... | H04N 9/045 348/222.1 |
| 2012/0050074 A1* | 3/2012 | Bechtel | ..................... | B60R 1/04 340/988 |
| 2012/0268566 A1* | 10/2012 | Kim | ....................... | H04N 5/3696 348/46 |
| 2013/0211682 A1* | 8/2013 | Joshi | .................... | G08G 1/0967 701/70 |
| 2014/0049645 A1* | 2/2014 | Wright | ................. | B60Q 1/1423 348/148 |
| 2014/0184863 A1* | 7/2014 | Tu | ............................ | H04N 9/07 348/280 |
| 2014/0293042 A1* | 10/2014 | Lynam | ..................... | B60R 1/00 348/118 |
| 2015/0271461 A1* | 9/2015 | Hayashi | ................... | H04N 9/07 348/223.1 |
| 2015/0303231 A1* | 10/2015 | Oganesian | ........ | H01L 27/14621 250/208.1 |
| 2017/0169265 A1* | 6/2017 | Wang | ................. | G06K 7/10752 |

(Continued)

OTHER PUBLICATIONS

Image Sensors World: "Aptina Explains Clarity+ Technology, Reveals 1.1umPixel Product"; http://image-sensors-world.blogspot.com/2013/07/aptina-explains-clarity-technology.html Jul. 10, 2017; 7 pages.

*Primary Examiner* — Timothy J Henn

(57) ABSTRACT

A color filter array apparatus is provided. The apparatus includes a first color filter array comprising color filters arranged in a first pattern and a second color filter array comprising color filters arranged in a second pattern. The first pattern and second pattern may be arranged to optimize the detection or viewing of first and second objects, respectively.

15 Claims, 3 Drawing Sheets

(56) References Cited

U.S. PATENT DOCUMENTS

2018/0007338 A1\* 1/2018 Hirota .................... G02B 5/20
2018/0027191 A2\* 1/2018 Grauer .................. H04N 5/332
2018/0088588 A1\* 3/2018 Ion ...................... G05D 1/0246

\* cited by examiner

COLOR FILTER ARRAY APPARATUS

INTRODUCTION

Apparatuses and methods consistent with exemplary embodiments relate to color filter arrays. More particularly, apparatuses and methods consistent with exemplary embodiments relate to color filter arrays optimized for detecting different types of objects.

SUMMARY

One or more exemplary embodiments provide an apparatus that includes a color filter array including two or more color filter patterns. More particularly, one or more exemplary embodiments provide a color filter array including two or more color filter patterns, each of the two or more color filter patterns are configured differently from each other to optimize detection of one or more types of objects or features in an image in different regions within an image or for different types of applications, for example to optimize viewing the image on a display by a human.

According to an exemplary embodiment, a color filter array apparatus is provided. The apparatus includes a first color filter array comprising color filters arranged in a first pattern, a second color filter array comprising color filters arranged in a second pattern. The arrangement of color filters of the second pattern is different from the arrangement of the color filters of the first pattern.

The first pattern may include color filters arranged to optimize detection of a first type of object or feature. The second pattern may include color filters arranged to optimize detection of a second type of object or feature.

The first type of object or feature may include a traffic light. The second type of object or feature may include lane markers.

The first pattern may include one green filter, two clear filters, and one red filter. The second pattern may include one blue filter and three clear filters.

The apparatus may also include a third color filter array comprising color filters arranged in a third pattern, wherein the arrangement of color filters of the third pattern is different from the first pattern and the second pattern. The third pattern may include s color filters arranged to optimize viewing of an object or feature on a display by a human.

The third pattern may include one red filter, one blue filter and two green filters.

The apparatus may include one imaging sensor configured to receive light passing through the first color filter array, the second color filter array, and the third color filter array.

The first pattern may be arranged between a plurality of the second pattern.

The apparatus may include one imaging sensor configured to receive light passing through the first color filter array and the second color filter array.

The first pattern and the second pattern may consist of a 2×2 unit cell array.

The first pattern may include three clear filters and one red filter and the second pattern may include four clear filters.

According to an exemplary embodiment, a color filter array apparatus is provided. The apparatus includes: a first color filter array including color filters arranged in a first pattern configured to optimize detection of a first type of object or feature in an image captured by a first sensor receiving light through the first color filter array; and a second color filter array including color filters arranged in a second pattern configured to optimize viewing of the image captured by the first sensor receiving light through the second color filter array.

The apparatus may also include a third color filter array comprising color filters arranged in a third pattern configured to optimize detection of a second type of object or feature in the image captured by a first sensor receiving light through the third color filter array.

The first pattern may include one green filter, two clear filters, and one red filter or one blue filter and three clear filters. The second pattern may include one red filter, one blue filter and two green filters.

Other objects, advantages and novel features of the exemplary embodiments will become more apparent from the following detailed description of exemplary embodiments and the accompanying drawings.

DETAILED DESCRIPTION OF EXEMPLARY EMBODIMENTS

Figure 1:
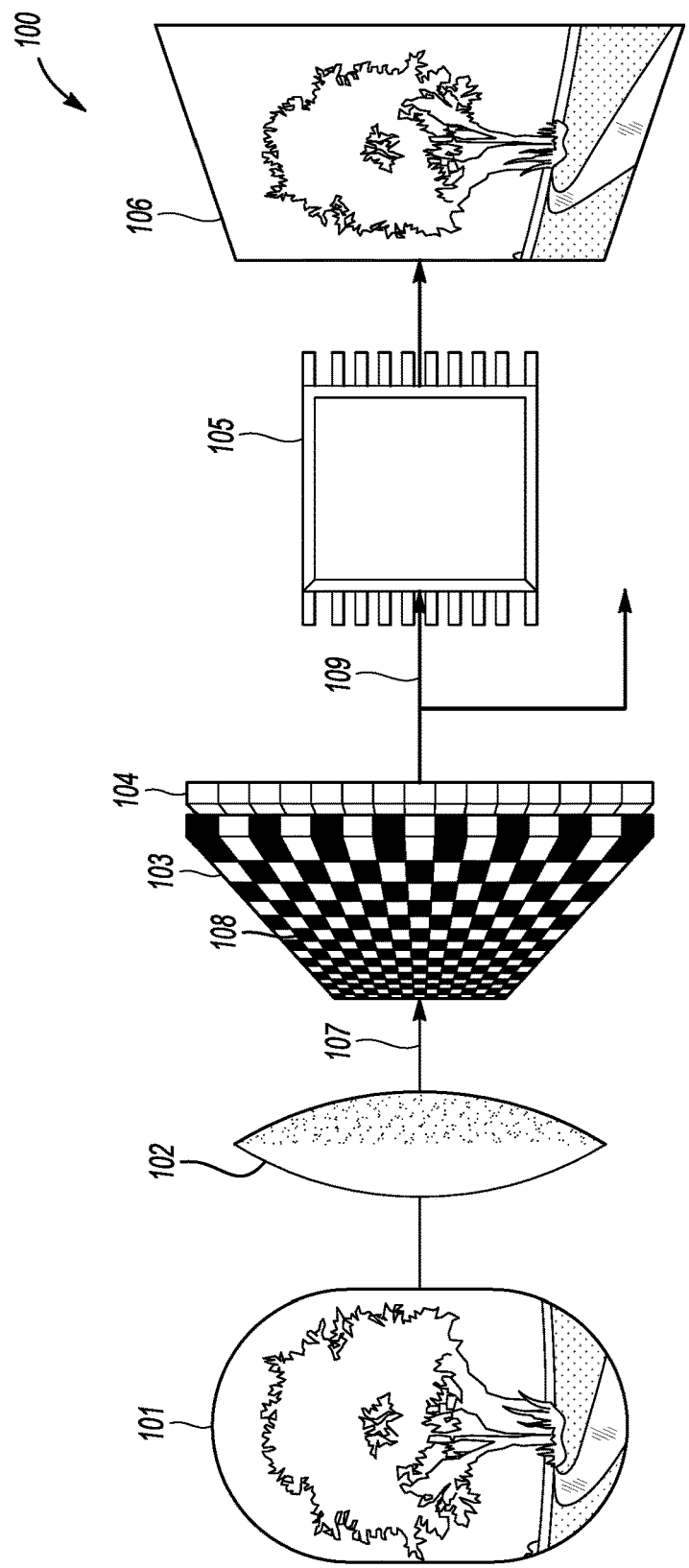
FIG. 1 shows a diagram of a color filter array as part of a camera apparatus according to an exemplary embodiment.

A color filter array apparatus will now be described in detail with reference to FIGS. 1-4 of the accompanying drawings in which like reference numerals refer to like elements throughout.

FIG. 1 shows a diagram 100 of a color filter array as part of a camera apparatus according to an exemplary embodiment. Referring to FIG. 1, light 107 reflected off an object 101 or scene may pass through a lens 102. The light 107 that passes through the lens 102 may then pass through color filter array 103. The sensor 104 captures the light that passes through the color filter array 103. The sensor 104 generates image data 109 based on the captured light. The image data 109 may be processed by image processor 105 or may be stored in raw format in memory. The image data 109 may then be processed to be displayed on a display 106

The color filter array 103 includes one or more color filters 108 that correspond to one or more sensing units of the sensor 104. The one or more color filters 108 may only allow light of a specific wavelength to pass through the respective color filters to the respective sensing unit. The sensor 104 captures the light that passes through the color filter array 103.

The sensor 104 includes an array of photosensors captures the light that passes through the color filter array 103 and converts that to electrical charges. The sensor may include one or more from among a pinned photodiode, a p-n junction photodiode, a Schottky photodiode, a photogate, or any other suitable photoconversion device or device that may accumulate and/or store photocharges.

The image processor 105 may include one or more from among a processor, a microprocessor, a central processing unit (CPU), a graphics processor, Application Specific Integrated Circuits (ASICs), Field-Programmable Gate Arrays (FPGAs), state machines, circuitry, and a combination of hardware, software and firmware components.

The display 106 may include one or more from among a display, a centrally-located display, a head up display, a windshield display, liquid crystal display, organic light emitting diode display, etc.

The image data may be stored on one or more from among floppy diskettes, optical disks, CD-ROMs (Compact Disc-Read Only Memories), magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, cache memory, and other type of media/machine-readable medium suitable for storing machine-executable instructions.

Figure 2:
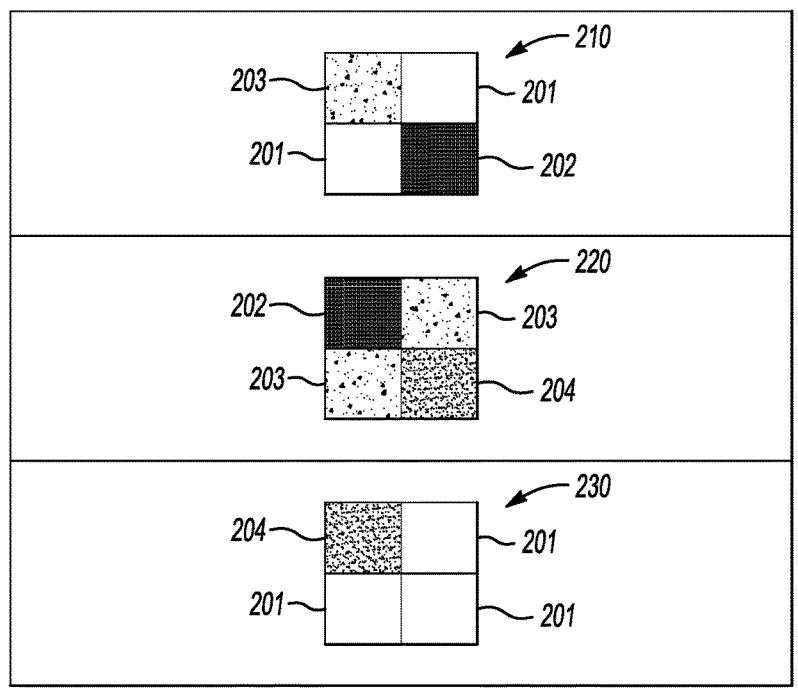
FIG. 2 shows examples of patterns of color filters according to an aspect of an exemplary embodiment.

FIG. 2 shows examples of patterns of color filters according to an aspect of an exemplary embodiment. Referring to FIG. 2, color filters are arranged in 2×2 patterns. The 2×2 arrangements shown are exemplary and other pattern arrangements may be used, e.g., 2×4, 4×2, 4×1, 1×4, 4×4, etc. The patterns may include a clear filter 201, a red color filter 202, a green color filter 203, and a blue color filter 204.

The clear filter 201 or transparent filter may pass white light or may pass light of all wavelengths. The clear filter 201 or transparent filter may also block infrared light. The red color filter 202 passes light corresponding to the red color wavelength. The green color filter 203 passes light corresponding to the green color wavelength. The blue color filter 204 passes light corresponding to the blue color wavelength. Color filter 201-204 are only examples of color filters and other color filters may be used.

The first pattern 210 includes two clear filters 201, a red color filter 202, and a green color filter 203. The first pattern 210 may be repeated across a color filter array and may be combined with other patterns. The light filtered by the first pattern 210 and captured by an image sensor may be used to process image data optimized for detecting traffic lights.

The second pattern 220 includes a blue color filter 204, a red color filter 202, and two green color filters 203. The second pattern 220 may be repeated across a color filter array and may be combined with other patterns. The light filtered by the second pattern 220 and captured by an image sensor may be used to process image data optimized for viewing on a display. For example, it may be optimized for viewing an image of an area behind a vehicle.

The third pattern 230 includes a blue color filter 204, and three clear filters 201. The third pattern 230 may be repeated across a color filter array and may be combined with other patterns. The light filtered by the third pattern 230 and captured by an image sensor may be used to process image data optimized for detecting lane features or for lane sensing.

The patterns 210, 220, and 230 are exemplary, and other patterns optimized for detecting other features and objects may be used in place of the exemplary patterns.

Figure 3:
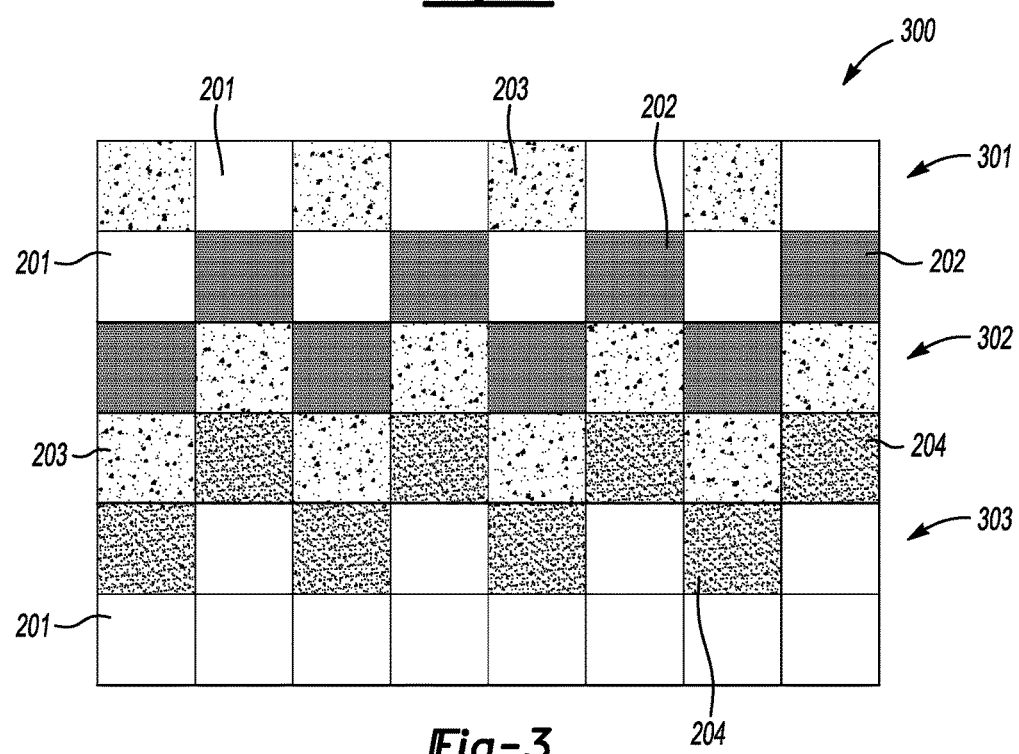
FIG. 3 shows an example of color filter array combining three patterns of color filters according to an aspect of an exemplary embodiment.

FIG. 3 shows an example of a color filter array combining three patterns of color filters according to an aspect of an exemplary embodiment. Referring to FIG. 3, a color filter array 300 is shown. The color filter array show includes three areas corresponding to three different patterns: a first area 301 on top, a second area 302 in the middle, and a third area 303 at the bottom. The arrangement and number of the areas and patterns shown is an example and other patterns, arrangement of areas, or number of areas and patterns may be used. For example, there may be two or four areas or more. In another example, the areas may be arranged side by side.

The first area 301 includes first pattern 210 arranged in a repetitive manner across the area. The second area includes second pattern 220 arranged in a repetitive manner across the area. The third area includes third pattern 230 arranged in a repetitive manner across the area.

Figure 4:
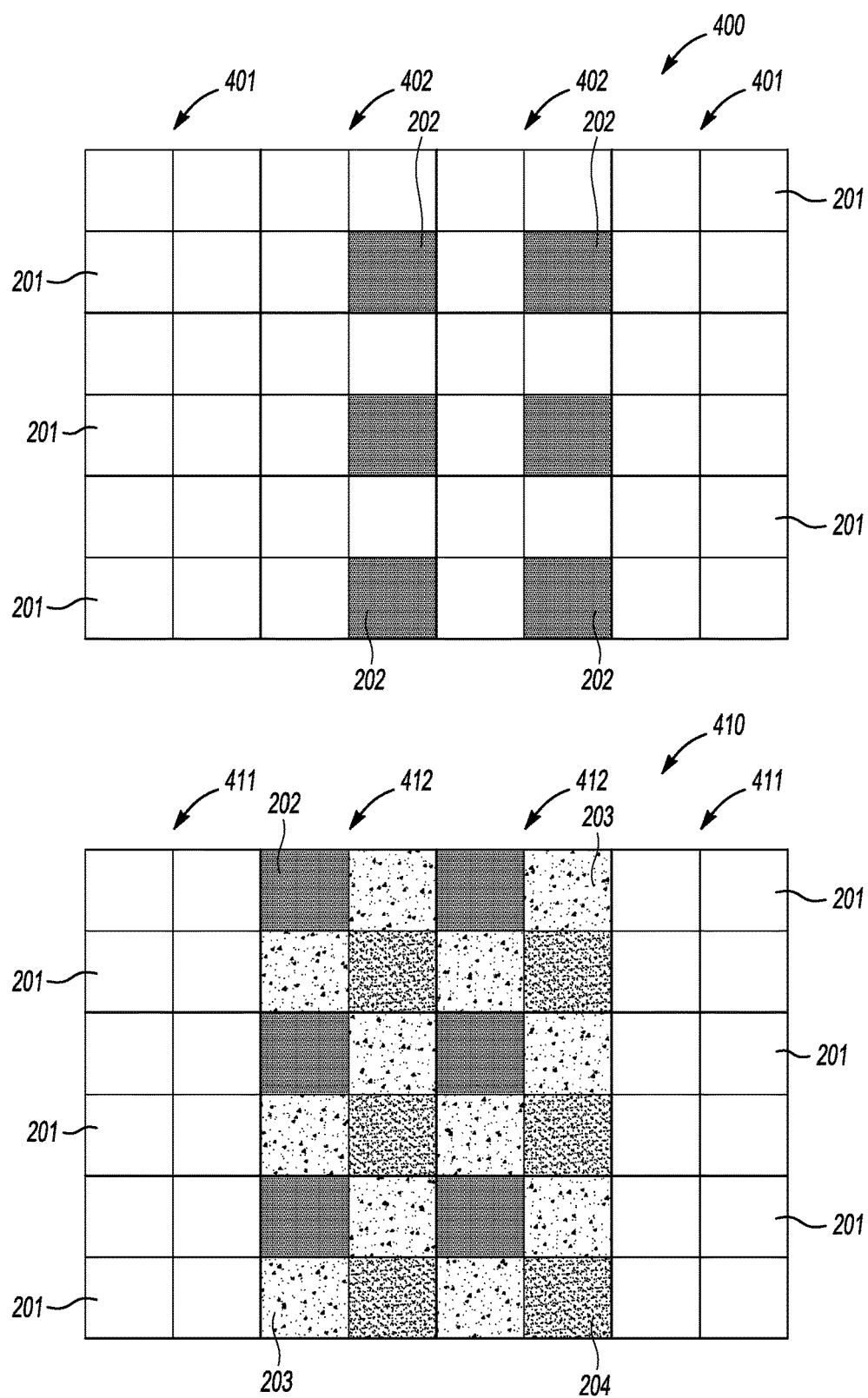
FIG. 4 shows an example of a color filter array combining two patterns of color filters according to an aspect of an exemplary embodiment.

FIG. 4 shows an example of a color filter array combining two patterns of color filters according to an aspect of an exemplary embodiment. Referring to FIG. 4, a first array 400 and a second array 410 are shown.

The first array 400 includes first areas 401 and second areas 402 arranged in between first area 401. First areas 401 includes only clear filter 201. Second areas 402 include a repetitive pattern of 2×2 color filters including three clear color filter 201 and one red color filter 202.

The second array 410 includes first areas 411 and second areas 412 arranged in between first areas 411. First areas 411 includes only clear color filter 201. Second areas 412 include a repetitive pattern of 2×2 color filters including one red color filter 202, two green color filters 203, and one blue color filter 204.

The following disclosure will enable one skilled in the art to practice the inventive concept. However, the exemplary embodiments disclosed herein are merely exemplary and do not limit the inventive concept to exemplary embodiments described herein. Moreover, descriptions of features or aspects of each exemplary embodiment should typically be considered as available for aspects of other exemplary embodiments.

It is also understood that where it is stated herein that a first element is "connected to," "attached to," "formed on," or "disposed on" a second element, the first element may be connected directly to, formed directly on or disposed directly on the second element or there may be intervening elements between the first element and the second element, unless it is stated that a first element is "directly" connected to, attached to, formed on, or disposed on the second element. In addition, if a first element is configured to "send" or "receive" information from a second element, the first element may send or receive the information directly to or from the second element, send or receive the information via a bus, send or receive the information via a network, or send or receive the information via intermediate elements, unless the first element is indicated to send or receive information "directly" to or from the second element.

Throughout the disclosure, one or more of the elements disclosed may be combined into a single device or into one or more devices. In addition, individual elements may be provided on separate devices.

One or more exemplary embodiments have been described above with reference to the drawings. The exemplary embodiments described above should be considered in a descriptive sense only and not for purposes of limitation. Moreover, the exemplary embodiments may be modified without departing from the spirit and scope of the inventive concept, which is defined by the following claims.

What is claimed is:

1. A color filter array apparatus, the apparatus comprising:
a first color filter array comprising color filters arranged in a first pattern; and
a second color filter array comprising color filters arranged in a second pattern,
wherein an arrangement of color filters of the second pattern is different from an arrangement of the color filters of the first pattern, and
wherein the first pattern comprises one green filter, two clear filters, and one red filter, and the second pattern comprises one blue filter and three clear filters.

2. The apparatus of claim 1, wherein the first pattern comprises color filters arranged to optimize detection of a first type of object or feature.

3. The apparatus of claim 2, wherein the second pattern comprises color filters arranged to optimize detection of a second type of object or feature.

4. The apparatus of claim 3, wherein the first type of object or feature comprises a traffic light.

5. The apparatus of claim 4, wherein the second type of object or feature comprises lane markers.

6. The apparatus of claim 3, further comprising a third color filter array comprising color filters arranged in a third pattern, wherein the arrangement of color filters of the third pattern is different from the first pattern and the second pattern.

7. The apparatus of claim 6, wherein the third pattern comprises color filters arranged to optimize viewing of an object or feature on a display by a human.

8. The apparatus of claim 7, wherein the third pattern comprises one red filter, one blue filter and two green filters.

9. The apparatus of claim 6, further comprising:
one imaging sensor configured to receive light passing through the first color filter array, the second color filter array, and the third color filter array.

10. The apparatus of claim 1, wherein the first pattern is aligned between a plurality of the second pattern.

11. The apparatus of claim 1, further comprising:
one imaging sensor configured to receive light passing through the first color filter array and the second color filter array.

12. The apparatus of claim 1, wherein the first pattern and the second pattern consist of a 2×2 unit cell array.

13. A color filter array apparatus, the apparatus comprising:
a first color filter array comprising color filters arranged in a first pattern; and
a second color filter array comprising color filters arranged in a second pattern,
wherein an arrangement of color filters of the second pattern is different from an arrangement of the color filters of the first pattern,
wherein the first pattern comprises three clear filters and one red filter, and
wherein the second pattern comprises four clear filters.

14. A color filter array apparatus, the apparatus comprising:
a first color filter array comprising color filters arranged in a first pattern configured to optimize detection of a first type of object or feature in an image captured by a first sensor receiving light through the first color filter array; and
a second color filter array comprising color filters arranged in a second pattern configured to optimize viewing of the image captured by the first sensor receiving light through the second color filter array,
wherein the first pattern comprises one green filter, two clear filters, and one red filter or one blue filter and three clear filters, and
wherein the second pattern comprises one red filter, one blue filter and two green filters.

15. The apparatus of claim 14, further comprising a third color filter array comprising color filters arranged in a third pattern configured to optimize detection of a second type of object or feature in the image captured by the first sensor receiving light through the third color filter array.

* * * * *